United States Patent
Hubbard et al.

(10) Patent No.: US 12,223,208 B2
(45) Date of Patent: *Feb. 11, 2025

(54) ENHANCED WRITE PERFORMANCE UTILIZING PROGRAM INTERLEAVE

(71) Applicant: Micron Technology, Inc., Boise, ID (US)

(72) Inventors: Daniel J. Hubbard, Boise, ID (US); Roy Leonard, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/513,742

(22) Filed: Nov. 20, 2023

(65) Prior Publication Data

US 2024/0086115 A1  Mar. 14, 2024

Related U.S. Application Data

(63) Continuation of application No. 17/727,131, filed on Apr. 22, 2022, now Pat. No. 11,875,061.

(51) Int. Cl.
*G06F 3/06* (2006.01)
*G06F 12/0846* (2016.01)
*G06F 12/0882* (2016.01)

(52) U.S. Cl.
CPC .......... *G06F 3/0659* (2013.01); *G06F 3/0604* (2013.01); *G06F 3/064* (2013.01); *G06F 3/0679* (2013.01); *G06F 12/0851* (2013.01); *G06F 12/0882* (2013.01)

(58) Field of Classification Search
CPC ...... G06F 3/0659; G06F 3/0604; G06F 3/064; G06F 3/0679; G06F 12/0851; G06F 12/0882; G06F 3/061; G06F 3/0656; G06F 12/0607; G06F 12/0871; G06F 12/0888; G06F 2212/1016; G06F 2212/214; G06F 2212/222; G06F 2212/7203; G06F 2212/7208; G06F 12/0246; G06F 3/0638; G06F 3/0688; G11C 7/1042; G11C 11/5628; G11C 16/10; G11C 16/32; G11C 7/1045; G11C 2211/5641
USPC ........................................................ 711/154
See application file for complete search history.

(56) References Cited

U.S. PATENT DOCUMENTS

2018/0285258 A1  10/2018  Muchherla et al.
2021/0318820 A1  10/2021  Jin et al.
2021/0365367 A1  11/2021  Kim et al.

*Primary Examiner* — Hua J Song
(74) *Attorney, Agent, or Firm* — LOWENSTEIN SANDLER LLP

(57) ABSTRACT

A system includes a memory and a processing device, operatively coupled to the memory, to perform operations including initiating a write operation to write data to a first multiple level cell (XLC) storage including a first XLC block and a second XLC storage including a second XLC block, and causing a first portion of the data to be written to a first number of pages of the first XLC block and a second portion of the data to be written to a second number of pages of the second XLC block using page level interleave. The first number of pages and the second number of pages are defined by an interleave mix including an interleave ratio between a first XLC write mode and a second XLC write mode.

20 Claims, 3 Drawing Sheets

ENHANCED WRITE PERFORMANCE UTILIZING PROGRAM INTERLEAVE

CROSS-REFERENCE TO RELATED APPLICATION(S)

The present application is a continuation of U.S. patent application Ser. No. 17/727,131, filed on Apr. 22, 2022 and entitled "ENHANCED WRITE PERFORMANCE UTILIZING PROGRAM INTERLEAVE", the entire contents of which are hereby incorporated by reference herein.

TECHNICAL FIELD

Embodiments of the disclosure relate generally to memory sub-systems, and more specifically, relate to enhanced write performance utilizing program interleave.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
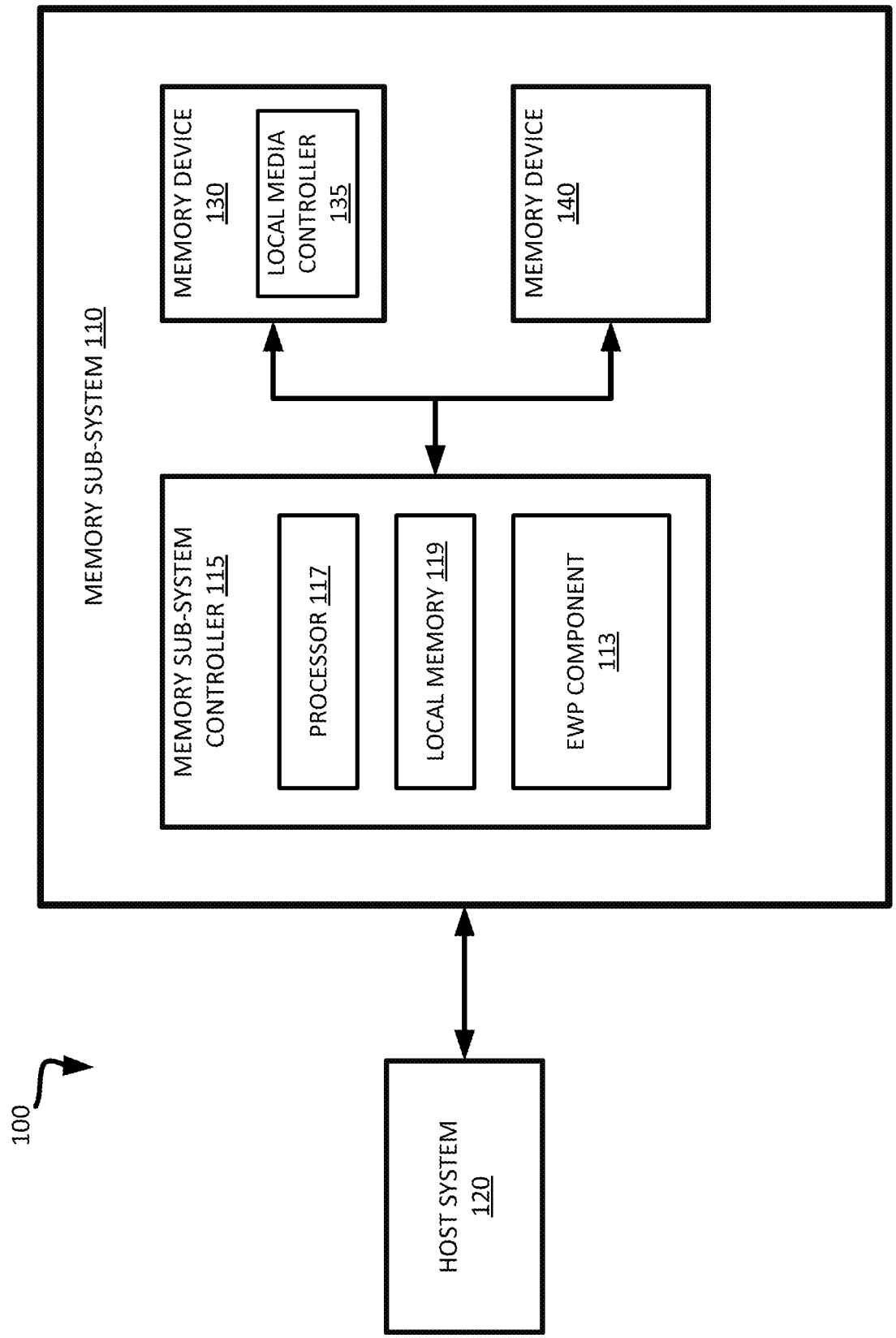
FIG. 1 illustrates an example computing system that includes a memory sub-system, in accordance with some embodiments of the present disclosure.

Aspects of the present disclosure are directed to enhanced write performance utilizing program interleave. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can include multiple bits arranged in a two-dimensional grid. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

A memory cell can be programmed (written to) by applying a certain voltage to the memory cell, which results in an electric charge being held by the memory cell. For example, a voltage signal $V_{CG}$ that can be applied to a control electrode of the cell to open the cell to the flow of electric current across the cell, between a source electrode and a drain electrode. More specifically, for each individual memory cell (having a charge Q stored thereon) there can be a threshold control gate voltage $V_T$ (herein also referred to as the "threshold voltage" or simply as "threshold") such that the source-drain electric current is low for the control gate voltage ($V_{CG}$) being below the threshold voltage, $V_{CG} < V_T$. The current increases substantially once the control gate voltage has exceeded the threshold voltage, $V_{CG} > V_T$. Because the actual geometry of the electrodes and gates varies from cell to cell, the threshold voltages can be different even for cells implemented on the same die. The memory cells can, therefore, be characterized by a distribution P of the threshold voltages, $P(Q,V_T)=dW/dV_T$, where dW represents the probability that any given cell has its threshold voltage within the interval $[V_T, V_T+dV_T]$ when charge Q is placed on the cell.

A memory device can have distributions $P(Q,V_T)$ that are narrow compared with the working range of control voltages tolerated by the cells of the device. Accordingly, multiple non-overlapping distributions $P(Q_k,V_T)$ ("valleys") can be fit into the working range allowing for storage and reliable detection of multiple values of the charge $Q_k$, k= 1, 2, 3 .... The distributions (valleys) are interspersed with voltage intervals ("valley margins") where none (or very few) of the memory cells of the device have their threshold voltages. Such valley margins can, therefore, be used to separate various charge states $Q_k$—the logical state of the cell can be determined by detecting, during a read operation, between which two valley margins the respective threshold voltage $V_T$ of the cell resides. Specifically, the read operation can be performed by comparing the measured threshold voltage $V_T$ exhibited by the memory cell to one or more reference voltage levels corresponding to known valley margins (e.g., centers of the margins) of the memory device.

One type of memory cell ("cell") is a single level cell (SLC), which stores 1 bit per cell and defines 2 logical states ("states") ("1" or "L0" and "0" or "L1") each corresponding to a respective $V_T$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_T$ level. For example, the "11" state can be an erased state and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_T$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell can use $2^n$ levels of charge to store n bits. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of memory cells.

Some memory sub-systems (e.g., SSDs) implement SLC caching for storing data. SLC caching utilizes SLC cache along with XLC storage. An XLC cell is a multiple level cell that stores more than one bit of state information per cell (e.g., MLC, TLC, QLC, PLC, as described above). SLC caching can be used to improve write speed since SLC programming is generally faster than XLC programming. Data written to the SLC cache can later be moved, asynchronously with respect to writing operations, from SLC cache to XLC storage to make room for future writes to the SLC cache (e.g., 1 bit in SLC cache can take up the same space as 4 bits in QLC storage). For example, the data can be moved in the background or during idle times to maintain performance. The SLC cache size can be selected in view of physical memory device constraints. For example, the SLC cache size can have a fixed size that does not exceed the available number of blocks on the memory device (e.g., NAND).

The SLC cache can include a static SLC cache having a fixed logical saturation size ("fixed size") and/or a dynamic SLC cache having a dynamic (e.g. modifiable or configurable) maximum logical saturation size ("dynamic maximum size"). Logical saturation refers to a portion of logical locations (e.g., logical block addresses (LBAs)) that contain data (e.g., a ratio of the size of the logical locations that contain data to the total size of the logical locations). Thus, logical saturation can refer to an amount of data logically written to the memory sub-system from the perspective of the host system. In contrast to logical saturation, physical saturation refers to a portion of physical locations (e.g., physical NAND locations) that contain data (e.g., a ratio of the size of the physical locations that contain data to the total size of the physical locations).

The fixed size of static SLC cache can be expressed as a share of a storage capacity of the memory sub-system ("memory sub-system storage capacity"). Thus, the static SLC cache can store an amount of data having a logical saturation up to the fixed size. The dynamic SLC cache can have a default or base maximum logical saturation size ("default maximum size"). The default maximum size can expressed as another share of the memory sub-system storage capacity. Thus, when the dynamic SLC cache size is set at the default maximum size, the dynamic SLC cache can store an amount of data having a logical saturation up to the default maximum size. An increase of the maximum size of dynamic SLC cache can be limited by a theoretical maximum logical saturation size ("theoretical maximum size"). The theoretical maximum size can be defined by the memory sub-system storage capacity and the type of XLC storage (e.g., memory sub-system storage capacity divided by bits per XLC cell). For example, if the XLC storage is QLC storage, then the theoretical maximum size can be 25% of the memory sub-system storage capacity. Thus, when the dynamic SLC cache size is set at the theoretical maximum size, the dynamic SLC cache can store an amount of data having a logical saturation up to the theoretical maximum size. These sizes can be predetermined by the manufacturer at the time of manufacture, and maintained in the SLC cache behavior profile stored in the memory sub-system.

Illustratively, for a memory sub-system having QLC storage and a storage capacity or maximum logical saturation of 512 gigabytes (GB), the static SLC cache size can be about 1% of the memory sub-system storage capacity (5 GB), the default maximum size of the dynamic SLC cache can be 10% of the memory sub-system storage capacity (51 GB), and the theoretical maximum size of the dynamic SLC cache can be 25% of the memory sub-system storage capacity (128 GB). If a host system were to write 100 GB to this memory sub-system, the memory sub-system controller could choose to write the first 5 GB to static SLC cache, and the next 51 GB to dynamic SLC cache. The memory sub-system controller can move the 56 GB of data from SLC cache to QLC storage during idle time or in the background. Once the SLC cache has been freed up after moving the data to XLC storage, the memory sub-system controller could then write the remaining 44 GB of data to SLC cache, and then move the 44 GB of data to QLC storage during idle time or in the background.

The memory sub-system can utilize a SLC cache behavior profile specifying at least one of: size rules of the cache (e.g., rules for increasing or decreasing the cache), usage rules of the cache, rules specifying the location of the cache, etc. The SLC cache behavior profile may include a single configuration rule, or multiple rules. For example, an initial SLC cache behavior profile may be loaded by a manufacturer onto the memory sub-system at the time of manufacture. The SLC cache behavior profile can be a static profile that remains unchanged over time. For example, the initial SLC cache behavior profile can persist through the life of the memory sub-system. Alternatively, the SLC cache behavior profile can be a dynamic profile that can be updated or replaced with an updated SLC cache behavior profile via a communications interface. For example, device usage characteristics may change (e.g., usage behavior of the device in which the memory sub-system is installed), and thus the host may replace the SLC cache behavior profile over the communications interface. Illustratively, a smartphone may receive an over the air (OTA) update that specifies an updated SLC cache behavior profile that modifies the performance characteristics of the memory sub-system in response to a change in usage behavior of the smartphone.

As described above, memory sub-systems that implement SLC caching can support writes to blocks in either an SLC write mode in which data is written directly to the SLC cache, or an XLC write mode in which data is indirectly written to the XLC storage (e.g., moved from the SLC cache to the XLC storage). The SLC write mode can result in a higher performance than the XLC write mode. With some XLC write modes (e.g., QLC write mode), a forced SLC cache implementation may be needed, in which all host writes go through the SLC cache before being written to XLC storage (e.g., indirect writing to XLC storage). This can result in different extremes for sequential write bandwidth.

For example, in the SLC write mode, data can be written in the SLC write mode to a block of XLC storage ("XLC block"). The operating the XLC block in the SLC write mode can reduce the (physical) memory sub-system storage capacity. Illustratively if the XLC block is a QLC block, then the memory sub-system storage capacity can be reduced to 25% since one bit will be written to a QLC cell that can store up to four bits. By extension, this means that the memory sub-system will be 100% physically full (e.g., all blocks written) at 25% of the total logical saturation. As another example, in the XLC write mode, data can be indirectly written to the XLC block via the SLC cache. The logical saturation can be up to 100% as the blocks in the SLC cache are used in the overprovisioning area of the memory device.

Some memory sub-systems can implement the SLC write mode in which one bit is written to each cell of the first XLC storage, a first XLC write mode similar to the XLC write mode as described above in which data is indirectly written to the first XLC storage via SLC cache, and a second XLC write mode in which multiple bits of data are written to each cell of the first XLC storage. The second XLC write mode can achieve a "mid-level performance" relative to the higher performance of the SLC write mode and the lower performance of the first XLC write mode. For example, the writes in the second XLC write mode can be slower than the writes to the SLC cache during the SLC write mode, while being faster than the writes to the first XLC storage during the first XLC write mode. For example, the first XLC storage/write mode can be QLC storage and the second XLC write mode can be a TLC write mode in which three bits are written to each cell of the QLC storage. However, the first XLC storage and the second XLC write mode can be any suitable first XLC storage/write mode and second XLC write mode in accordance with embodiments described herein.

Similar to the SLC write mode, writing data to the first XLC storage while operating in the second XLC write mode reduces the memory sub-system storage capacity. Illustratively, if the first XLC storage is QLC storage and the second XLC storage is TLC storage, then the memory sub-system storage capacity can be reduced to 75% since three bits will be written to a QLC cell that can store up to four bits. By extension, this means that the memory sub-system will be 100% physically full (e.g., all blocks written) at 75% of the total logical saturation.

The second XLC write mode can enable sustained sequential write performance at an increased amount of logical saturation relative to the first XLC write mode (e.g., up to 75% of the total logical saturation). However, the second XLC write mode may not enable such sustained sequential write performance at higher amounts of logical saturation. For example, with respect to some memory sub-systems (e.g., 512 GB capacity memory sub-systems), it can be challenging to meet expectations for sustained sequential write performance at amounts of logical saturation of at least 85% of the total logical saturation.

Aspects of the present disclosure address the above and other deficiencies by providing a memory sub-system (e.g., SSD) that implements enhanced write performance utilizing program interleave. For example, a memory sub-system can include a memory device including a number of first XLC blocks including first XLC cells and a number of second XLC blocks including second XLC cells. Each first XLC and second XLC block can include a number of pages, where each page includes a number cells capable of storing a number of bits per cell greater than SLC storage (i.e., greater than one bit per cell).

A memory sub-system controller can receive data from a host system for writes to the memory device. The memory sub-system controller can cause the data to be written to the memory device by implementing the program interleave.

In some implementations, host system data writes can be interleaved at a block level granularity ("block level interleave"). More specifically, the memory sub-system controller can write data to a first XLC block in the first XLC write mode until the first XLC block is full. After filling the first XLC block, the memory sub-system controller can write data to a second XLC block in the second XLC write mode until the second XLC block is full, etc. Such block level interleaving may not be efficient. For example, it can take from about 5 seconds to about 10 seconds to fully write a QLC block.

To address this, embodiments described herein can interleave host system data writes at a page level of granularity ("page level interleave"). More specifically, the memory sub-system controller can alternate between writing a portion of data to a first number of pages of a first XLC block in the first XLC write mode (i.e., data is indirectly written to each page via SLC cache), and writing another portion of data to a second number of pages of a second XLC block in the second XLC write mode (i.e., data is directly written to each page). Multiple block stripes can remain open (e.g., SLC/QLC/TLC) to enable program operations to perform page level interleave between the first XLC write mode and the second XLC write mode. In some embodiments, the host system data writes are initiated in the first XLC write mode. In some embodiments, the host system data writes are initiated in the second XLC write mode.

In some embodiments, each first XLC block is a QLC block including QLC cells, and each second XLC block is one of an MLC block or a TLC block. In some embodiments, each first XLC block is a PLC block including PLC cells, and each second XLC block is one of an MLC block, a TLC block or a QLC block.

The number of pages written to the first XLC block in the first XLC write mode and the number of pages written the second XLC block in the second XLC write mode can be determined in accordance with a predefined interleave mix programmed within the memory sub-system. For example, the interleave mix can be defined as the ratio between the number of pages written to the first XLC block in the first XLC write mode to the number of pages written to the second XLC block in the second XLC write mode (e.g., the number writes performed in first XLC write mode and the number of writes performed in the second XLC write mode).

The write operation can alternate between the first and second XLC write modes in accordance with the interleave mix.

In some embodiments, the interleave mix corresponds to a 1:1 ratio between the first XLC write mode and the second XLC write mode (i.e., even mixing). That is, a single page can be written in the first XLC write mode for every single page written in the second XLC write mode. For example, a first page can be written in the first XLC write mode, a second page can be written in the second XLC write mode, a third page can be written in the first XLC write mode, a fourth page can be written in the second XLC write mode, etc. As another example, a first page can be written in the second XLC write mode, a second page can be written in the first XLC write mode, a third page can be written in the second XLC write mode, a fourth page can be written in the first XLC write mode, etc.

In some embodiments, the interleave mix corresponds to a 2:1 ratio between the first XLC write mode and the second XLC write mode. That is, two pages can be written in the first XLC write mode for every single page written in the second XLC write mode. For example, a first page and a second page can be written in the first XLC write mode, a third page can be written in the second XLC write mode, etc. As another example, a first page can be written in the second XLC write mode, a second page and a third page can be written in the first XLC write mode, etc.

The interleave mixes described above are purely exemplary, and any suitable interleave mix can be achieved in accordance with embodiments described herein. For example, the interleave mix can corresponds to a 3:1 ratio between the first XLC write mode and the second XLC write mode, a 4:1 ratio between the first XLC write mode and the second XLC write mode, a 3:2 ratio between the first XLC write mode and the second XLC write mode, etc.

The page level interleave described herein can enable enhanced write performance at relatively high amounts of logical saturation. In some embodiments, the page level interleave described herein enables sustained sequential write performance at an amount of logical saturation greater than or equal to 85% of the logical saturation. For example, the page level interleave described herein can enable sustained sequential write performance at an amount of logical saturation greater than or equal to 87% logical saturation. The amount of logical saturation depends at least in part on the interleave mix. Accordingly, the page level interleave described above can improve aggregate write performance (e.g., a mixture of SLC/QLC and TLC writes) at higher logical saturation. Further details regarding the operations performed by the memory sub-system controller will be described below with reference to FIGS. 1-3.

Advantages of the present disclosure include, but are not limited to, improved memory device performance and QoS. For example, the page level interleave described herein can improve sustained sequential write performance by alternating writes in respective write modes at the page level.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory sub-system 110 includes an enhanced write performance (EWP) component 113. In some embodiments, the memory sub-system controller 115 includes at least a portion of the EWP component 113. In some embodiments, the EWP component 113 is part of the host system 120, an application, or an operating system. In other embodiments, local media controller 135 includes at least a portion of EWP component 113 and is configured to perform the functionality described herein.

For example, the memory device 130 can include SLC cache, a first XLC storage having a number of first XLC blocks and second XLC storage having a second number of XLC blocks. In some embodiments, the first and second XLC storage have a same type. For example, the first and second XLC storage can each be QLC storage including QLC cells. The memory sub-system 110 can implement at least a first XLC write mode in which data is indirectly written to the first XLC storage via SLC cache, and a second XLC write mode in which multiple bits of data are written directly to the second XLC storage. In some embodiments, the first XLC write mode is a QLC write mode and the second XLC storage is one of an MLC write mode or a TLC write. In some embodiments, the first XLC write mode is a PLC write mode and the second XLC write mode is one of the MLC storage, the TLC write mode or the QLC write mode. Such examples should not be considered limiting.

The EWP component 113 can implement enhanced write performance utilizing program interleave. For example, the EWP component 113 can receive data from the host system 120, and cause the data to be written to the memory device 130 using program interleave. In some embodiments, the EWP component 113 causes the data to be written to the memory device 130 using page level interleave. More specifically, within each first XLC block, the EWP component 113 can cause data writes to alternate between a first number of pages of a first XLC block in first XLC write mode, and a second number of pages of a second XLC block in the second XLC write mode (i.e., data is directly written to each page). Multiple block stripes can remain open (e.g., SLC/QLC/TLC) to enable program operations to perform page level interleave between the first XLC write mode and the second XLC write mode. In some embodiments, the host system data writes are initiated in the first XLC write mode. In some embodiments, the host system data writes are initiated in the second XLC write mode.

The alternating between the first number of pages written in the first XLC write mode and the second number of pages written in the second XLC write mode can be determined in accordance with a predefined interleave mix programmed within the memory sub-system. For example, the interleave mix can be defined as the ratio between the number of pages written to the block in the first XLC write mode to the number of pages written to the block in the second XLC write mode (e.g., the number writes performed in first XLC write mode and the number of writes performed in the second XLC write mode). The write operation can alternate between the first and second XLC write modes in accordance with the interleave mix until the write operation is complete, or the block is full. If the block is full and the write operation is not complete, data can be written in a new block in accordance with the interleave mix.

In some embodiments, the interleave mix corresponds to a 1:1 ratio between the first XLC write mode and the second XLC write mode (i.e., even mixing). That is, a single page can be written to the first XLC block in the first XLC write mode for every single page written to the second XLC block in the second XLC write mode. For example, a first page can be written in the first XLC write mode, a second page can be written in the second XLC write mode, a third page can be written in the first XLC write mode, a fourth page can be written in the second XLC write mode, etc. As another example, a first page can be written in the second XLC write mode, a second page can be written in the first XLC write mode, a third page can be written in the second XLC write mode, a fourth page can be written in the first XLC write mode, etc.

In some embodiments, the interleave mix corresponds to a 2:1 ratio between the first XLC write mode and the second XLC write mode. That is, two pages can be written to the first XLC block in the first XLC write mode for every single page written to the second XLC block in the second XLC write mode. For example, a first page and a second page can be written in the first XLC write mode, a third page can be written in the second XLC write mode, etc. As another example, a first page can be written in the second XLC write mode, a second page and a third page can be written in the first XLC write mode, etc.

The interleave mixes described above are purely exemplary, and any suitable interleave mix can be achieved in accordance with embodiments described herein. For example, the interleave mix can corresponds to a 3:1 ratio between the first XLC write mode and the second XLC write mode, a 4:1 ratio between the first XLC write mode and the second XLC write mode, a 3:2 ratio between the first XLC write mode and the second XLC write mode, etc.

The page level interleave described herein can enable enhanced write performance at relatively high amounts of logical saturation. In some embodiments, the page level interleave described herein enables sustained sequential write performance at an amount of logical saturation greater than or equal to 85% of the logical saturation. For example, the page level interleave described herein can enable sustained sequential write performance at an amount of logical saturation greater than or equal to 87% logical saturation. Accordingly, the page level interleave described above can improve aggregate write performance (e.g., a mixture of SLC/QLC and TLC writes) at higher logical saturation.

The amount of logical saturation depends at least in part on the interleave mix. For example, at a 1:1 interleave mix for writing data to pages of a QLC block between the QLC write mode and the TLC write mode, three bits can written to each cell of a first page of a QLC block during the single write in TLC write mode, and four bits can be written to each cell of a second page of the QLC block during the single write in the QLC write mode. In this example, an improved write performance at up to about 87.5% of the total logical saturation can be achieved (e.g., seven bits per cell divided by eight total bits per cell supported by the two pages). In this exemplary scenario, the aggregate write performance can be about 68% higher than performing writes in the QLC write mode (writing data to the SLC cache and moving the data to QLC storage).

As another example, at a 2:1 interleave mix for writing data to pages of a QLC block between the QLC write mode and the TLC write mode, three bits can be written to each cell of a first page of a QLC block during the single write in the TLC write mode, and four bits can be written to each cell of each of the two pages of the QLC block during the two writes in the QLC write mode. In this example, an improved write performance at up to about 91.7% logical saturation can be achieved (e.g., eleven bits per cell divided by the twelve total bits per cell supported by the three pages). In this exemplary scenario, the aggregate write performance can be about 38% higher than performing writes in the QLC write mode. Further details regarding the operation of the EWP component 113 are described below with reference to FIGS. 2-4.

Figure 2:
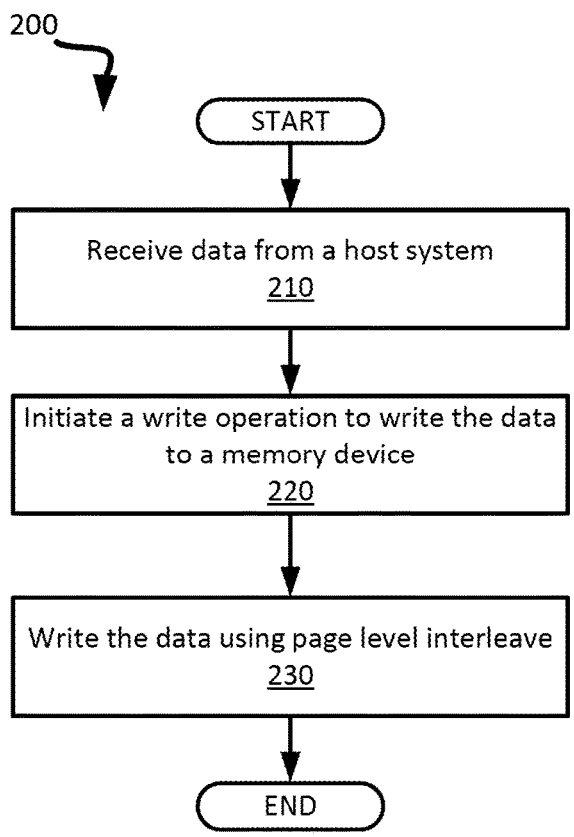
FIG. 2 is a flow diagram of example methods for implementing enhanced write performance utilizing program interleave, in accordance with some embodiments of the present disclosure.

FIG. 2 is a flow diagram of an example method 200 for implementing dynamic adjustment of data storage for enhanced data retention, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the EWP component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, processing logic receives data from a host system. For example, the host system can be the host system 120 of FIG. 1.

At operation 220, processing logic initiates a write operation to write the data to a memory device. For example, the memory device can include SLC cache, first XLC storage and second XLC storage. In some embodiments, each of the first XLC storage and the second XLC storage is QLC storage. In some embodiments, each of the first XLC storage and the second XLC storage is PLC storage. Such examples should not be considered limiting.

The processing logic can implement a number of write modes. For example, the write modes can include a first XLC write mode in which data is indirectly written to the first XLC storage via the SLC cache, and a second XLC write mode in which data is directly written to the second XLC storage. While operating in the second XLC write mode, the number of bits of data stored in each cell of the second XLC storage can be less than the logical capacity of the cells. For example, if the second XLC storage is QLC storage including QLC cells, the second XLC write mode can be one of: an MLC write mode for storing two bits per QLC cell or a TLC write mode for storing three bits per QLC cell. As another example, if the first XLC storage is PLC storage including PLC cells, the second XLC write mode can be one of: the MLC write mode, the TLC write mode, or a QLC write mode for storing four bits per PLC cell.

At operation 230, the processing logic writes the data to the memory device. For example, the processing logic can cause the data to be written to a first XLC block of the first XLC storage and a second XLC block of the second XLC storage using page level interleave. To perform the page level interleave, the processing logic can cause data writes to alternate between the first XLC block and the second XLC block. For example, the processing logic can cause data to be written to a first number of pages of the first XLC block in the first XLC write mode, a second number of pages of the second XLC block in the second XLC write mode, a third number of pages of the third XLC block, a fourth number of pages of the fourth XLC block, etc. Multiple block stripes can remain open (e.g., SLC/QLC/TLC) to enable program operations to perform page level interleave between the first XLC write mode and the second XLC write mode. In some embodiments, the host system data writes are initiated in the first XLC write mode. In some embodiments, the host system data writes are initiated in the second XLC write mode.

The first number of pages written in the first XLC write mode and the second number of pages written in the second XLC write mode can be determined in accordance with a predefined interleave mix programmed within the memory sub-system. For example, the interleave mix can be defined as the ratio between the number of pages written to the first XLC block in the first XLC write mode to the number of pages written to the second XLC block in the second XLC write mode (e.g., the number writes performed in first XLC write mode and the number of writes performed in the second SLC write mode). The write operation can alternate between the first and second XLC write modes in accordance with the interleave mix. If the first XLC block or the second XLC block is full and the write operation is not complete, data can be written in a new block in accordance with the interleave mix. Further details regarding writing data using page level interleave will be described below with reference to FIG. 3.

Figure 3:
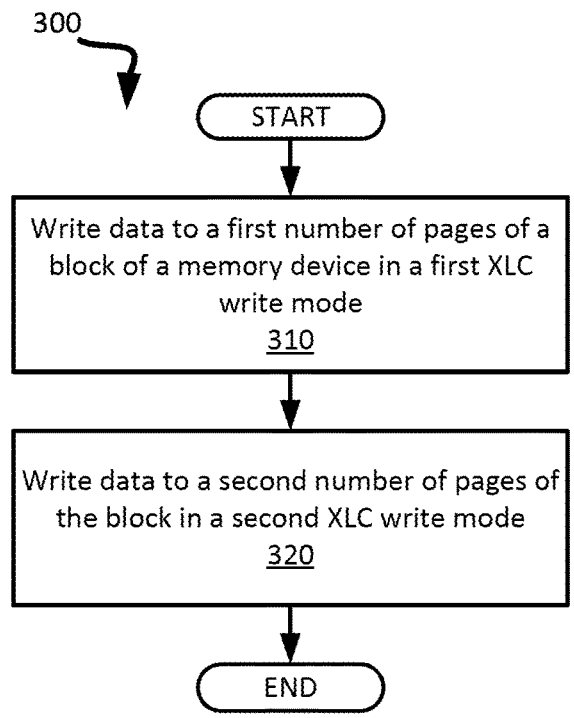
FIG. 3 is a flow diagram of example methods for writing data to a memory device using page level interleave, in accordance with some embodiments of the present disclosure.

FIG. 3 is a flow diagram of an example method 300 for writing data to a memory device using page level interleave (e.g., operation 230 of FIG. 2), in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the EWP component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, processing logic writes a first portion (e.g., subset) of data to a first number of pages of a first XLC block of first XLC storage of a memory device in a first XLC write mode. At operation 320, processing logic writes a second portion (e.g., subset) of the data to a second number of pages of a second XLC block of second XLC storage in a second XLC write mode. Further details regarding the first XLC storage, the second XLC storage, the first XLC write mode and the second XLC write mode are described above with reference to FIGS. 1-2.

The first number of pages written to the first XLC block in the first XLC write mode and the second number of pages written to the second XLC block in the second XLC write mode can be determined in accordance with a predefined interleave mix programmed within the memory sub-system. For example, the interleave mix can be defined as the ratio between the number of pages written to the block in the first XLC write mode to the number of pages written to the block in the second XLC write mode (e.g., the number writes performed in first XLC write mode and the number of writes performed in the second XLC write mode). The write operation can alternate between the first and second XLC write modes in accordance with the interleave mix until the write operation is complete, or the block is full. If the block is full and the write operation is not complete, data can be written in a new block in accordance with the interleave mix.

In some embodiments, the interleave mix corresponds to a 1:1 ratio between the first XLC write mode and the second XLC write mode (i.e., even mixing). That is, a single page can be written to the first XLC block in the first XLC write mode for every single page written to the second XLC block in the second XLC write mode. For example, a first page can be written in the first XLC write mode, a second page can be written in the second XLC write mode, a third page can be written in the first XLC write mode, a fourth page can be written in the second XLC write mode, etc. As another example, a first page can be written in the second XLC write mode, a second page can be written in the first XLC write mode, a third page can be written in the second XLC write mode, a fourth page can be written in the first XLC write mode, etc.

In some embodiments, the interleave mix corresponds to a 2:1 ratio between the first XLC write mode and the second XLC write mode. That is, two pages can be written to the first XLC block in the first XLC write mode for every single page written to the second XLC block in the second XLC write mode. For example, a first page and a second page can be written in the first XLC write mode, a third page can be written in the second XLC write mode, etc. As another example, a first page can be written in the second XLC write mode, a second page and a third page can be written in the first XLC write mode, etc.

The interleave mixes described above are purely exemplary, and any suitable interleave mix can be achieved in accordance with embodiments described herein. For example, the interleave mix can corresponds to a 3:1 ratio between the first XLC write mode and the second XLC write mode, a 4:1 ratio between the first XLC write mode and the second XLC write mode, a 3:2 ratio between the first XLC write mode and the second XLC write mode, etc.

The page level interleave described herein can enable enhanced write performance at relatively high amounts of logical saturation. In some embodiments, the page level interleave described herein enables sustained sequential write performance at an amount of logical saturation greater than or equal to 85% of the logical saturation. For example, the page level interleave described herein can enable sustained sequential write performance at an amount of logical saturation greater than or equal to 87% logical saturation. Accordingly, the page level interleave described above can improve aggregate write performance (e.g., a mixture of SLC/QLC and TLC writes) at higher logical saturation.

The amount of logical saturation depends at least in part on the interleave mix. For example, at a 1:1 interleave mix for writing data to pages of a QLC block between the QLC write mode and the TLC write mode, three bits can written to each cell of a first page of a QLC block during the single write in TLC write mode, and four bits can be written to each cell of a second page of the QLC block during the single write in the QLC write mode. In this example, an improved write performance at up to about 87.5% of the total logical saturation can be achieved (e.g., seven bits per cell divided by eight total bits per cell supported by the two pages). In this exemplary scenario, the aggregate write performance can be about 68% higher than performing writes in the QLC write mode (writing data to the SLC cache and moving the data to QLC storage).

As another example, at a 2:1 interleave mix for writing data to pages of a QLC block between the QLC write mode and the TLC write mode, three bits can be written to each cell of a first page of a QLC block during the single write in the TLC write mode, and four bits can be written to each cell of each of the two pages of the QLC block during the two writes in the QLC write mode. In this example, an improved write performance at up to about 91.7% logical saturation can be achieved (e.g., eleven bits per cell divided by the twelve total bits per cell supported by the three pages). In this exemplary scenario, the aggregate write performance can be about 38% higher than performing writes in the QLC write mode.

Figure 4:
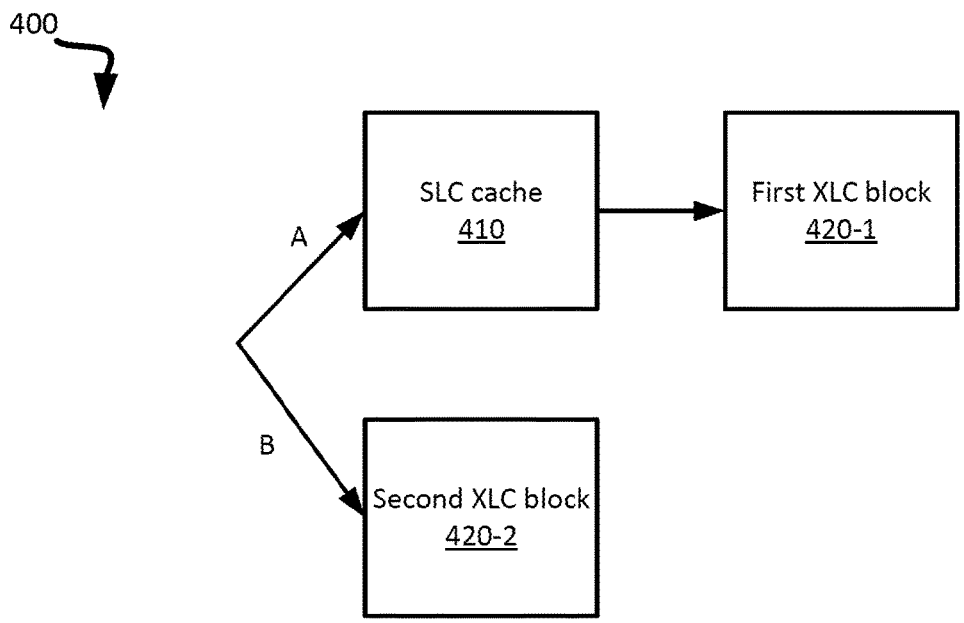
FIG. 4 is a diagram illustrating an implementation of enhanced write performance utilizing program interleave, in accordance with some embodiments of the present disclosure.

FIG. 4 is a diagram 400 illustrating an implementation of enhanced write performance utilizing program interleave, in accordance with some embodiments of the present disclosure. The diagram 400 shows an SLC cache 410, a first XLC block 420-1 and a second XLC block 420-2. While in a first XLC write mode, data can be written to the SLC cache 410, and then moved to the first XLC block 420-1. While in a second XLC write mode, data can be written directly to the second XLC block 420-2. Further details regarding the SLC cache 410, the first XLC block 420-1, the second XLC block 420-2, the first XLC write mode and the second XLC write mode are described above with reference to FIGS. 1-3.

Respective portions of data received from a host system (e.g., the host system 120 of FIG. 1) can be written to the first XLC block 420-1 (via the SLC cache 410) or to the second XLC block 420-2 using page level interleave. The page level interleave can be defined using an interleave mix. In this example, the interleave mix corresponds to an A:B ratio between the first XLC write mode and the second XLC write mode, respectively. In some embodiments, A equals B, such that the ratio is 1:1 (i.e., even mixing). In some embodiments, A is different from B, such that the ratio is not 1:1. For example, A=2 and B=1. As another example, A=3 and B=1. As yet another example, A=3 and B=2. Such examples should not be considered limiting.

As an illustrative example, assume that the first XLC block and the second XLC block each include QLC cells, the first XLC write mode is a QLC write mode and the second XLC write mode is a TLC write mode. If the interleave ratio is 1:1 (e.g., A=B=1), one page can be written to the first XLC block 420-1 via SLC cache 410 in the first XLC write mode, and then one page can be written to the second XLC block 420-2 in the second XLC write mode (or vice versa). If the interleave ratio is 2:1 (e.g., A=2 and B=1), two pages can be written to the first XLC block 420-1 via SLC cache 410 in the first XLC write mode, and then one page can be written to the second XLC block 420-2 in the second XLC write mode (or vice versa). If the interleave ratio is 3:2 (e.g., A=3 and B=3), three pages can be written to the first XLC block 420-1 via SLC cache 410 in the first XLC write mode, and then two pages can be written to the second XLC block 420-2 in the second XLC write mode (or vice versa).

The control of the movement, or folding, of data from SLC cache 410 to the first XLC block 420-1 can occur independently from the control of the alternating writes to the blocks 420-1 and 420-2. For example, a host cursor can control to which of the blocks 420-1 or 420-2 to write a portion of the data, while a folding cursor can control the folding of the data from SLC cache 410 to the first XLC block 420-1.

Figure 5:
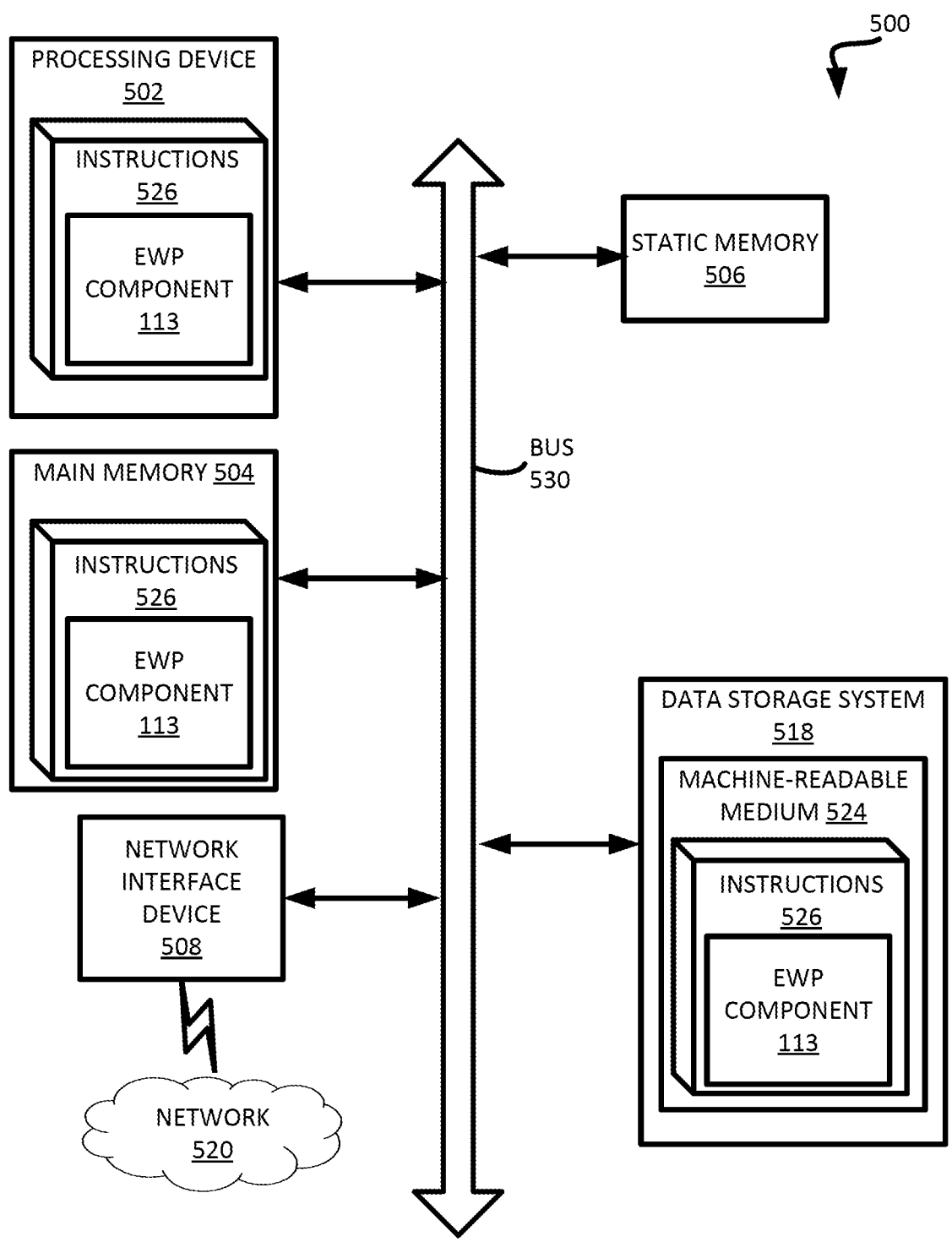
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the EWP component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or RDRAM, etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to an EWP component (e.g., the EWP component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory; and
   a processing device, operatively coupled with memory, to perform operations comprising:
   initiating a write operation to write data to a first multiple level cell (XLC) storage comprising a first XLC block and a second XLC storage comprising a second XLC block; and
   causing a first portion of the data to be written to a first number of pages of the first XLC block and a second portion of the data to be written to a second number of pages of the second XLC block using page level interleave, wherein the first number of pages and the second number of pages are defined by an interleave mix comprising an interleave ratio between a first XLC write mode and a second XLC write mode.

2. The system of claim 1, wherein the first portion of the data is written in the first XLC write mode and the second portion of the data is written in the second XLC write mode.

3. The system of claim 1, wherein the first XLC write mode corresponds to a quad-level cell (QLC) write mode.

4. The system of claim 3, wherein the second XLC write mode corresponds to at least one of: a multi-level cell (MLC) write mode or a triple-level cell (TLC) write mode.

5. The system of claim 1, wherein the first XLC write mode corresponds to a penta-level cell (PLC) write mode.

6. The system of claim 5, wherein the second XLC write mode corresponds to at least one of: multi-level cell (MLC) write mode, a triple-level cell (TLC) write mode, or a quad-level cell (QLC) write mode.

7. The system of claim 1, wherein the first XLC storage and the second XLC storage each comprise quad-level cell (QLC) cells.

8. A method comprising:
   initiating, by a processing device, a write operation to write data to a first multiple level cell (XLC) storage comprising a first XLC block and a second XLC storage comprising a second XLC block; and
   causing, by the processing device, a first portion of the data to be written to a first number of pages of the first XLC block and a second portion of the data to be written to a second number of pages of the second XLC block using page level interleave, wherein the first number of pages and the second number of pages are defined by an interleave mix comprising an interleave ratio between a first XLC write mode and a second XLC write mode.

9. The method of claim 8, wherein the first portion of the data is written in the first XLC write mode and the second portion of the data is written in the second XLC write mode.

10. The method of claim 8, wherein the first XLC write mode corresponds to a quad-level cell (QLC) write mode.

11. The method of claim 10, wherein the second XLC write mode corresponds to at least one of: a multi-level cell (MLC) write mode or a triple-level cell (TLC) write mode.

12. The method of claim 8, wherein the first XLC write mode corresponds to a penta-level cell (PLC) write mode.

13. The method of claim 12, wherein the second XLC write mode corresponds to at least one of: multi-level cell (MLC) write mode, a triple-level cell (TLC) write mode, or a quad-level cell (QLC) write mode.

14. The method of claim 8, wherein the first XLC storage and the second XLC storage each comprise quad-level cell (QLC) cells.

15. A non-transitory computer-readable storage medium comprising instructions that, when executed by a processing device, cause the processing device to perform operations comprising:
   initiating a write operation to write data to a first multiple level cell (XLC) storage comprising a first XLC block and a second XLC storage comprising a second XLC block; and
   causing a first portion of the data to be written to a first number of pages of the first XLC block and a second portion of the data to be written to a second number of pages of the second XLC block using page level interleave, wherein the first number of pages and the second number of pages are defined by an interleave mix comprising an interleave ratio between a first XLC write mode and a second XLC write mode.

16. The non-transitory computer-readable storage medium of claim 15, wherein the first XLC write mode corresponds to a quad-level cell (QLC) write mode.

17. The non-transitory computer-readable storage medium of claim 16, wherein the second XLC write mode corresponds to at least one of: a multi-level cell (MLC) write mode or a triple-level cell (TLC) write mode.

18. The non-transitory computer-readable storage medium of claim 15, wherein the first XLC write mode corresponds to a penta-level cell (PLC) write mode.

19. The non-transitory computer-readable storage medium of claim 18, wherein the second XLC write mode corresponds to at least one of: multi-level cell (MLC) write mode, a triple-level cell (TLC) write mode, or a quad-level cell (QLC) write mode.

20. The non-transitory computer-readable storage medium of claim 15, wherein the first XLC storage and the second XLC storage each comprise quad-level cell (QLC) cells.

* * * * *